(12) United States Patent
Takei et al.

(10) Patent No.: US 6,628,349 B1
(45) Date of Patent: Sep. 30, 2003

(54) LIQUID CRYSTAL DISPLAY SUBSTRATE HAVING TFTS IN BOTH AN IMAGE DISPLAY AREA AND IN A PERIPHERAL CIRCUIT AREA

(75) Inventors: Michiko Takei, Kawasaki (JP); Yasuyoshi Mishima, Kawasaki (JP); Mitsuru Chida, Kawasaki (JP); Kohta Yoshikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 346 days.

(21) Appl. No.: 09/651,876

(22) Filed: Aug. 30, 2000

(30) Foreign Application Priority Data

Oct. 29, 1999  (JP) ............................................ 11-309850
Aug. 31, 1999  (JP) ............................................ 11-245324
Jul. 14, 2000  (JP) ........................................ 2000-213685

(51) Int. Cl.$^7$ .......................... G02F 1/136; G02F 1/1345
(52) U.S. Cl. ........................... 349/43; 349/149; 438/154
(58) Field of Search .................... 349/43, 149; 438/154, 438/155; 257/408, 412

(56) References Cited

U.S. PATENT DOCUMENTS

| | | | | | |
|---|---|---|---|---|---|
| 5,534,716 A | * | 7/1996 | Takemura | .................... | 257/72 |
| 6,140,162 A | * | 10/2000 | Yeo | .............................. | 438/155 |
| 6,146,930 A | * | 11/2000 | Kobayashi et al. | ......... | 438/154 |
| 6,255,705 B1 | * | 7/2001 | Zhang et al. | ................ | 257/412 |
| 6,359,320 B1 | * | 3/2002 | Yamazaki et al. | .......... | 257/408 |
| 2002/0139982 A1 | * | 10/2002 | Zhang et al. | ................. | 257/72 |

* cited by examiner

Primary Examiner—Julie Ngo
(74) Attorney, Agent, or Firm—Greer, Burns & Crain, Ltd.

(57) ABSTRACT

A liquid crystal display substrate including gate and drain bus lines that are electrically insulated from each other at cross areas, pixel electrodes between the cross areas, and first thin film transistors connecting corresponding drain bus lines and pixel electrodes. Each first thin film transistor includes a channel region where current flows in a first direction, and first and second impurity doped regions of, respectively, first and second impurity concentrations. The first and second doped regions sandwich the channel region. The second impurity concentration is higher than the first. Also, a second thin film transistor is formed in the peripheral circuit area, and includes a channel region where current flows in a second direction that is perpendicular to the first direction. Third impurity doped regions, disposed on both sides of the channel region, have a third impurity concentration.

4 Claims, 11 Drawing Sheets

LIQUID CRYSTAL DISPLAY SUBSTRATE HAVING TFTS IN BOTH AN IMAGE DISPLAY AREA AND IN A PERIPHERAL CIRCUIT AREA

This application is based on Japanese Patent Applications HEI 11-309850 filed on Oct. 29, 1999, HEI 11-245324 filed on Aug. 31, 1999, and 2000-213685 filed on Jul. 14, 2000, the entire contents of which are incorporated herein by reference.

BACKGROUND OF THE INVENTION a) Field of the Invention

The present invention relates to a thin film transistor, a liquid crystal display substrate, a MIS type field effect transistor (MISFET), and their manufacture methods, and more particularly to a transistor having a lightly doped drain structure, a liquid display substrate having such transistors, and their manufacture methods.

b) Description of the Related Art

Thin film transistors (TFT) are used as switching elements of pixels of an active matrix type liquid crystal display device. A small off-current of TFT is necessary for holding electric charges accumulated by a pixel electrode. The off-current can be reduced by adopting a lightly doped drain (LDD) structure.

If both the source and drain regions of TFT have the LDD structure, an on-current reduces. In order to reduce the off-current and retain a sufficient on-current, it can be considered preferable if the LDD structure is formed only on the drain side.

For example, in order to form the LDD structure in only the drain region, first impurity ions are implanted into the drain and source regions at a low concentration. Thereafter, the area in the drain region at the low concentration is covered with a resist mask and impurity ions are implanted at a relatively high concentration. The source region is not covered with the resist mask. If the gate length is short, a high precision of position alignment is required when a resist mask is formed to cover the low concentration region on the drain side and expose the source region.

A TFT using a polysilicon thin film has a carrier mobility higher than a TFT using amorphous silicon. Therefore, by using polysilicon TFT, an image display area and its driver circuit can be formed on the same substrate. A larger on-current is required for TFT in the peripheral circuit than a switching TFT of each pixel. In this context, it may occur that the LDD structure is adopted for TFT in the pixel area and not for TFT in the peripheral circuit.

If the LDD structure is adopted for the source and drain regions of TFT in the pixel area and not adopted for TFT in the peripheral circuit, the number of photolithography processes increases more than if the LDD structure is adopted for all TFTs. An increase in the number of photography processes results in a higher manufacture cost and a lower manufacture yield.

SUMMARY OF THE INVENTION

It is an object of the present invention to provide TFT having a small off-current and not requiring a high alignment precision even if the gate length is short.

It is another object of the present invention to provide a liquid crystal display substrate in which TFT in an image display area has a small off-current and TFT in a peripheral circuit has a large on-current, and a method of manufacturing such a substrate.

It is another object of the present invention to provide a method of manufacturing TFT or MISFET having the LDD structure, capable of suppressing an increase in the number of manufacture processes as small as possible.

According to one aspect of the present invention, there is provided a thin film transistor comprising: a current path pattern defining a current path, the current path pattern being made of semiconductor material and formed on an insulating principal surface of a substrate; a gate pattern three-dimensionally crossing the current path pattern at least in first and second cross areas, the gate pattern defining a channel region of the current path pattern in an area superposed upon by the gate pattern; and a gate insulating film disposed between the current path pattern and the gate pattern in the first and second cross areas, wherein the current path pattern has an LDD structure on both sides of the channel region in the first cross area, the LDD structure including low concentration regions in contact with the channel region and high concentration regions in contact with the low concentration regions, and has an impurity concentration in areas in contact with the channel region in the second cross area higher than an impurity concentration of the low impurity concentration regions.

Since the LDD structure is formed on both sides of the channel region in the first contact area, it is not necessary to mask only one side of the gate during manufacture. Accordingly, a high position alignment precision is not required even if the gate length is short. Since the LDD structure is formed in one of the first and second cross areas, an off-current can be made small.

According to another aspect of the present invention, there is provided a liquid crystal display substrate comprising: a plurality of gate bus lines extending in a row direction and formed on an insulating principal surface of a substrate; a plurality of drain bus lines extending in a column direction and formed on the principal surface of the substrate, the drain bus line being electrically insulated from the gate bus line in a cross area in which the gate bus line and the drain bus line cross each other; a pixel electrode disposed in each of cross areas between the gate bus line and the drain bus line; a current path pattern disposed in and along each cross area between the gate bus line and the drain bus line, the current path pattern being made of semiconductor material and three-dimensionally crossing a corresponding one of the gate bus lines at least in two cross areas, a channel region of the current path pattern being formed in an area superposed upon by the gate bus line, a first end portion of the current path pattern being electrically connected to a corresponding one of the drain bus lines, and a second end portion of the current path pattern being electrically connected to a corresponding one of the pixel electrodes; and a gate insulating film disposed between the gate bus line and the current path pattern in the cross area, wherein the current path pattern has an LDD structure on both sides of the channel region nearer to the first end portion, the LDD structure including low concentration regions in contact with the channel region and high concentration regions in contact with the low concentration regions, and has an impurity concentration in areas in contact with the channel region nearer to the second end portion higher than an impurity concentration of the low impurity concentration regions.

Since the LDD structure is formed on both sides of the channel region nearer to the first end portion, it is not necessary to mask only one side of the gate during manufacture. Accordingly, a high position alignment precision is not required even if the gate length is short. Since the LDD structure is formed in one of the first and second cross areas, an off-current can be made small.

If the substrate is rotated by 90°, the row direction and the column direction are replaced with each other. Namely, in the present specification, the row direction and the column direction mean the two directions intersecting with each other and do not necessarily mean horizontal and vertical directions.

According to another aspect of the present invention, there is provided a method of manufacturing a semiconductor display substrate, comprising the steps of: preparing a substrate having an insulating principal surface, and an image display area and a peripheral circuit area defined in a plane of the principal surface, the peripheral circuit area being disposed at a side of the image display area; forming a plurality of first current path patterns distributed in a matrix shape on the principal surface of the substrate in the image display area and a second current path pattern in the peripheral circuit area, in such a manner that each of the first current path patterns includes a portion flowing current at least in a column direction and the second current path patter includes a portion flowing current at least in a row direction; covering the first and second current path patterns with a gate insulating film; forming a plurality of gate patterns on the gate insulating film in such a manner that the gate pattern crosses the column directionally flowing current portion of the first current path pattern in the image display area and crosses the row directionally flowing current portion of the second current path pattern in the peripheral circuit area; implanting impurity ions into the first and second current path patterns by using the gate patterns as a mask; and irradiating an energy beam into the first and second current path patterns along an oblique direction relative to a plane of the principal surface to activate doped impurities so that the energy beam is irradiated in the first current path pattern in a shaded state of one of both sides of the gate pattern and irradiated in the second current pattern on both sides of the gate pattern.

The energy beam is not irradiated in a region of the shaded state of one of both sides of the gate bus line, and impurities are not activated. The region whose impurities are not activated serves as the low concentration region of the LDD structure. If two TFTs are formed having gates whose extension directions are shifted by 90°, one TFT can have a one-side LDD structure, and the other TFT can have a both-side LDD structure.

DETAILED DESCRIPTION OF THE PREFERRED EMBODIMENTS

With reference to FIG. 1 and FIGS. 4A to 4I, a TFT and a liquid crystal display substrate using TFTs according to the first embodiment of the invention will be described.

Figure 1:
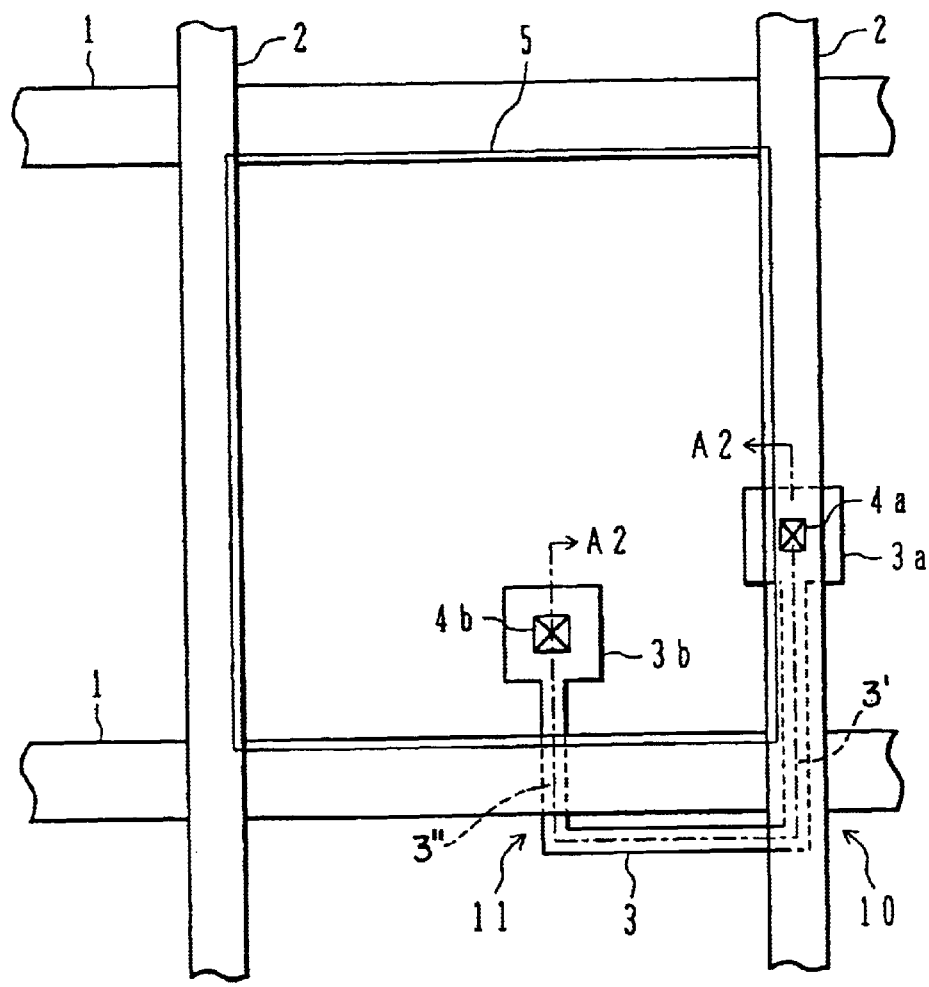
FIG. 1 is a plan view of a TFT according to a first embodiment.

FIG. 1 is a plan view showing one pixel area of a liquid crystal display substrate according to the first embodiment. On an insulating principal surface of a glass substrate, a plurality of gate bus lines 1 and drain bus lines 2 are formed. Each gate bus line 1 extends in a row direction in FIG. 1, and each drain bus line extends in a column direction in FIG. 1. The gate bus line 1 and drain bus line 2 are electrically insulated in their cross areas.

In each cross area between the gate bus line 1 and drain bus line 2, a current path pattern 3 made of polysilicon is disposed. One end portion 3a of the current path 3 is electrically connected to a corresponding drain bus line 2 via a contact hole 4a. The current path pattern 3 extends along the drain bus line 2 from the end portion 3a to a cross area 10 between the drain bus line 2 and gate bus line In this cross area 10, the current path pattern 3 crosses a corresponding gate bus line 1. The current pattern 3 extends in parallel to the corresponding gate bus line 1 and again crosses the corresponding gate bus line 1 in a cross area 11. Namely, a multi-gate type TFT is formed in which the current path pattern 3 crosses the gate bus line in the two cross areas 10 and 11. The other end portion 3b of the current path pattern 3 is electrically connected to a pixel electrode 5 via a contact hole 4b.

On both sides of a channel layer 3' of the current path pattern 3 in the cross area 10, the LDD structure is formed which has a low concentration region in contact with the channel layer and a high concentration region in contact with the low concentration region. In areas in contact with the channel layer 3" in the cross area 11, a low concentration region is not formed. Namely, the high concentration regions are in direct contact with this a channel layer. This high concentration region has an impurity concentration higher than that of the low concentration region in the cross area 10.

Next, with reference to FIGS. 2A to 2D, the cross sectional structure of the liquid crystal display substrate shown in FIG. 1 and its manufacture method will be described. FIGS. 2A to 2D are cross sectional views taken along one-dot chain line A2-A2 shown in FIG. 1.

Figure 2A:
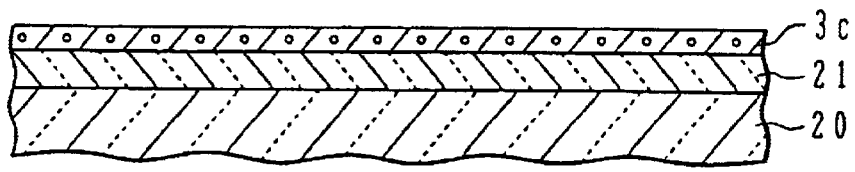
FIGS. 2A to 2D are cross sectional views of a substrate illustrating a manufacture method for the TFT of the first embodiment.

As shown in FIG. 2A, on the surface of a glass substrate 20, an underlie $SiO_2$ film 21 is formed by plasma enhanced chemical vapor deposition (PE-CVD). On this underlie $SiO_2$ film 21, a polysilicon film 3c is formed to a thickness of 50 nm. In place of a lamination substrate of the glass substrate 20 and underlie $SiO_2$ film 21, another substrate having an insulating principal surface may be used. A method of forming the polysilicon film 3c will be described briefly.

On the underlie $SiO_2$ film 21, an amorphous silicon film is first deposited by PE-CVD. A XeCl excimer laser is applied to the amorphous silicon film to polycrystallize it. The excimer laser is exposed to a narrow stripe area on the substrate surface. This narrow stripe exposure area is moved at each one shot along a direction perpendicular to the longer axis direction of the exposure area to apply the laser to almost the whole area of the amorphous silicon film. For example, the energy density of the laser in the laser exposure area is 400 mJ/cm², and an overlap factor during exposure area movement is 90% or higher.

Figure 2B:
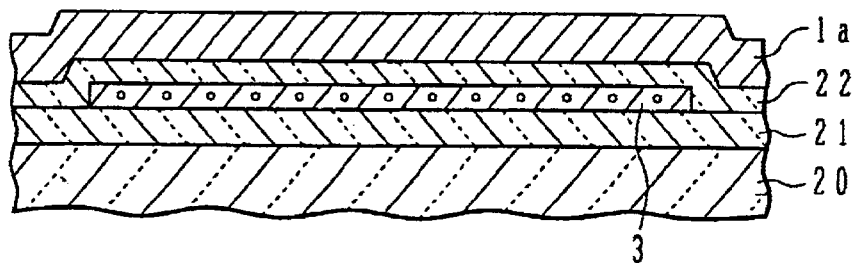

As shown in FIG. 2B, the polysilicon film 3c is patterned to leave a current path pattern 3. For example, the polysilicon film 3c is etched through reactive ion etching using mixture gas of $CF_4$ and $O_2$. The plan shape of the current path pattern 3 has been described with reference to FIG. 1. A gate insulating film 22 of $SiO_2$ is deposited to a thickness of 100 nm on the current path pattern 3 and exposed underlie $SiO_2$ film 21. For example, the gate insulating film 22 is deposited by PE-CVD using $SiH_4$ and $N_2O$ as source gas.

On this gate insulating film 22, an aluminum (Al) film 1a is deposited to a thickness of 300 nm. For example, the Al film 1a is deposited by sputtering.

Next, the processes of forming the structure shown in FIG. 2C will be described. The Al film 1a is patterned to leave the gate bus line 1. The plan shape of the gate bus line 1 has been described with reference to FIG. 1. In the cross area 10, a resist pattern 30 is formed covering a partial surface area of the gate insulating film 22 continuous with the sides of the gate bus lines 1.

By using the resist pattern 30 as a mask, the gate insulating film 22 is etched. A gate insulating film 22a is therefore left under the resist pattern 30. The gate insulating film 22a outward projects from the sides of the gate bus line 1. The length of this outward projected area is, for example, 0.5 µm. In the cross area 11, the gate bus line 1 serves as a mask so that a gate insulating film 22b is left between the gate bus line 1 and current path pattern 3. After the gate insulating film 22 is etched, the resist pattern 30 is removed.

By using the gate bus line 1 as a mask, a first phosphorous ion doping is performed. This first phosphorous ion doping is performed under the conditions of hydrogen diluted $PH_3$ as an ion source, an acceleration energy of 70 keV and a dose of $1 \times 10^{14}$ cm$^{-2}$. As different from ion implantation used by semiconductor manufacture processes, mass spectrometry of an ion beam emitted from an ion source is not performed. With this ion doping, phosphorous ions are doped into the current path pattern 3 under the gate insulating film 22a to form low concentration regions 3d. Phosphorous ions are not doped just under the gate bus line 1.

Next, by using the gate bus line 1 and gate insulating film 22a as a mask, a second phosphorous ion doping is performed. The second phosphorous ion doping is performed under the conditions of an acceleration energy of 10 keV and a dose of $5 \times 10^{15}$ cm$^{-2}$. In the cross area 11, high concentration regions 3e are therefore formed on both sides of the channel layer 3" just under the gate bus line 1. In the cross area 10, a high concentration region 3e in contact with the low concentration region 3d is therefore formed.

After the second phosphorous ion doping, laser annealing is performed to activate the doped phosphorous ions. The laser used is an XeCl excimer laser and the energy density is 200 to 300 mJ/cm².

Figure 2C:
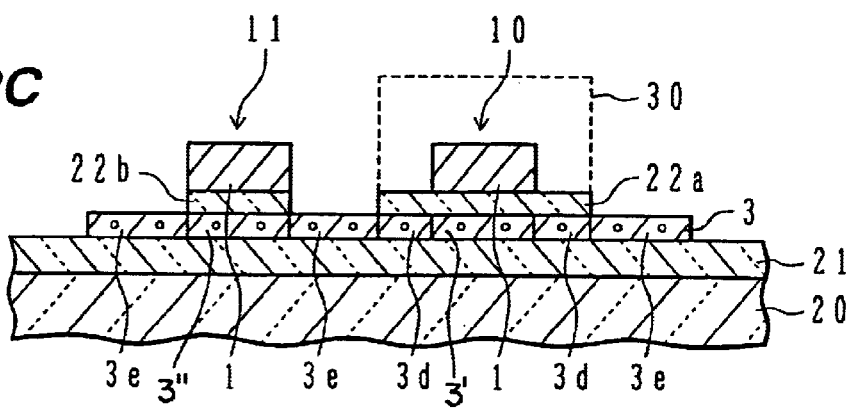
Figure 2D:
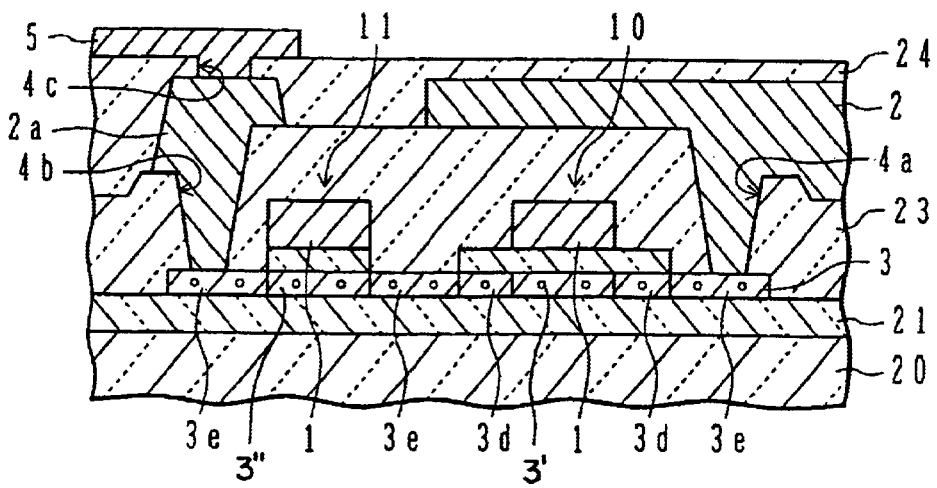

As shown in FIG. 2D, an interlayer insulating film 23 is formed over the whole substrate surface, the interlayer insulating film having a two-layered structure of an $SiO_2$ film and an SiN film. The thickness of the interlayer insulating film 23 is, for example, 400 to 500 nm. Contact holes 4a and 4b are formed through the interlayer insulating film 23. The upper surface of the end portion of the current path pattern 3 on the side of the cross area 10 is exposed at the bottom of the contact hole 4a. The upper surface of the end portion of the current path pattern 3 on the side of the cross area 11 is exposed at the bottom of the contact hole 4b.

A drain bus line 2 and an interlayer connection member 2a respectively having a three-layer structure of Ti/Al/Ti are formed on the interlayer insulating film 23. The drain bus line 2 is therefore connected to the one end portion of the current path pattern 3 via the contact hole 4a, and the interlayer connection member 2a is therefore connected to the other end portion of the current path pattern 3 via the contact hole 4b.

A passivation film 24 is formed on the interlayer insulating film 23, covering the drain bus line 2 and interlayer connection member 2a. For example, the passivation film 24 is made of SiN. A contact hole 4c is formed through the passivation film 24 to expose an upper surface of the interlayer connection member 2a. A pixel electrode 5 made of indium tin oxide (ITO) is formed on the passivation film 24. The pixel electrode 5 is therefore connected to the interlayer connection member 2a via the contact hole 4c.

As shown in FIG. 2D, the current path pattern 3 has, on both sides of the channel layer in the cross area 10, the low concentration regions 3d in contact with the channel layer and the high concentration regions 3e in contact with the low concentration regions 3d, constituting the LDD structure. The channel layer 3" in the cross area 11 is in direct contact with the high concentration regions 3e having an impurity concentration higher than that of the low concentration region 3d.

TFTs of the first embodiment and other TFTs of various types for comparison were formed and on-current and off-current were measured. The measurement results will be described with reference to FIGS. 3A and 3B and FIGS. 4A to 4I.

Figure 4A:
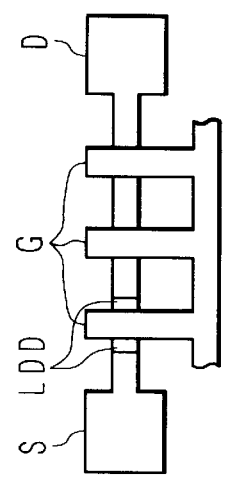
FIGS. 4A to 4I are schematic plan views of TFTs of various types whose on-current and off-current were evaluated.
Figure 4B:
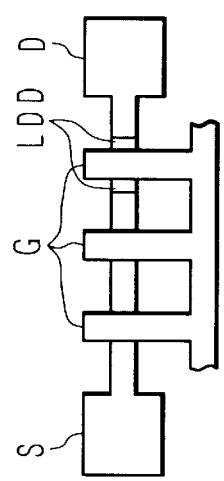
Figure 4C:
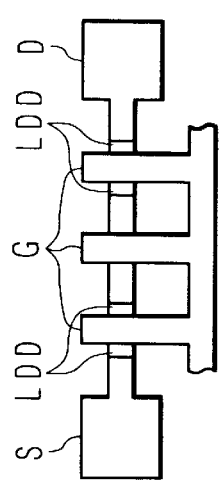
Figure 4D:
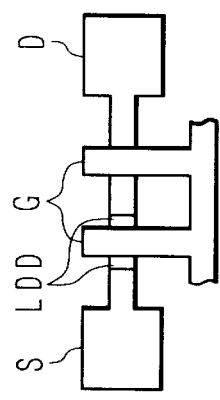
Figure 4E:
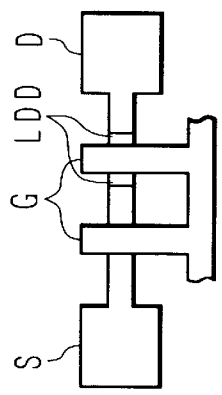
Figure 4F:
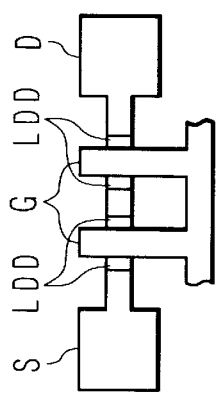
Figure 4G:
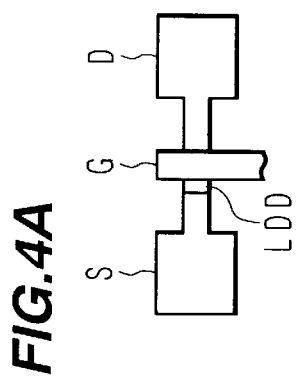
Figure 4H:
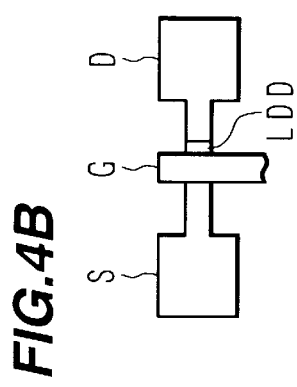
Figure 4I:
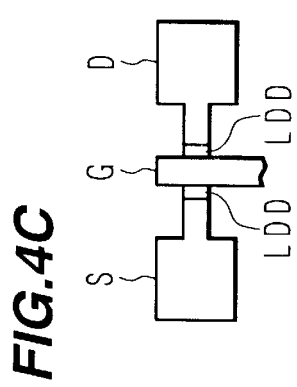

FIGS. 4A to 4I are schematic plan views of TFTs of various types whose on-current and off-current were evaluated. TFTs shown in FIGS. 4A to 4C are single-gate TFTs having one gate G, a source S and a drain D. TFTs shown in FIGS. 4D to 4F are two-gate TFTs having two gates G, a source S and a drain D. TFTs shown in FIGS. 4G to 4I are triple-gate TFTs having three gates G, a source S and a drain D. The gate length of the single gate TFT is 2 µm, the gate length of the double-gate TFT is 4 µm in total, and the gate length of the triple-gate TFT is 6 µm in total.

TFT shown in FIG. 4A has the LDD structure having a low concentration region LDD on the source side of the channel layer, TFT shown in FIG. 4B has the LDD structure on the drain side, TFT shown in FIG. 4C has the LDD structure on both the source and drain sides.

TFTs shown in FIGS. 4D and 4G have the LDD structure on both sides of a gate G nearest to the source. TFTs shown in FIGS. 4E and 4H have the LDD structure on both sides of a gate G nearest to the source. TFTs shown in FIGS. 4F and 4I have the LDD structure on both sides of gates G at both ends. In addition to TFTs shown in FIGS. 4A to 4I, single-gate TFTs, double-gate TFTs and triple-gate TFTs respectively having no LDD structure were also formed.

Figure 3A:
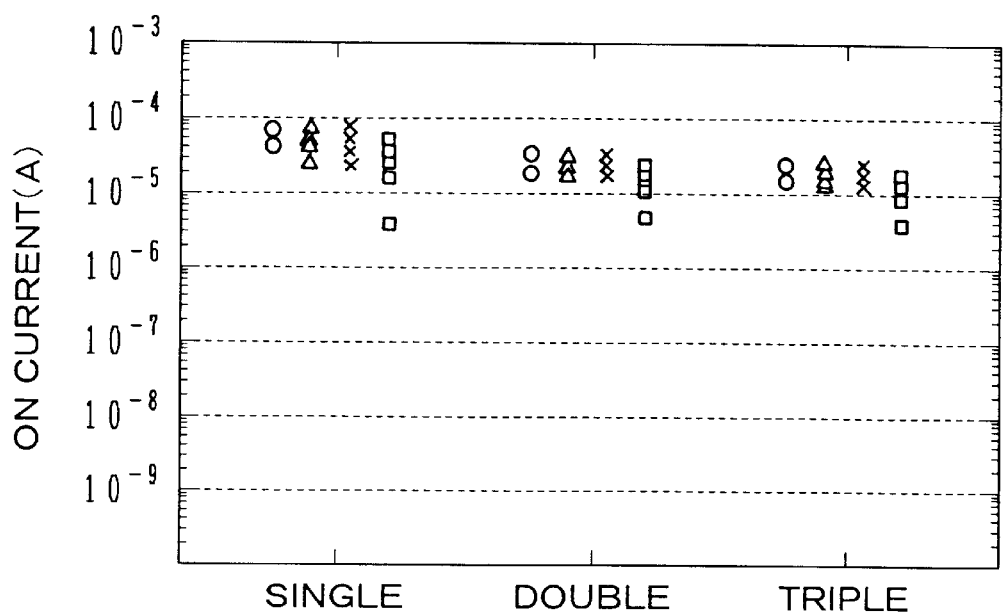
FIGS. 3A and 3B are graphs showing on-current and off-current of TFTs of various types.
Figure 3B:
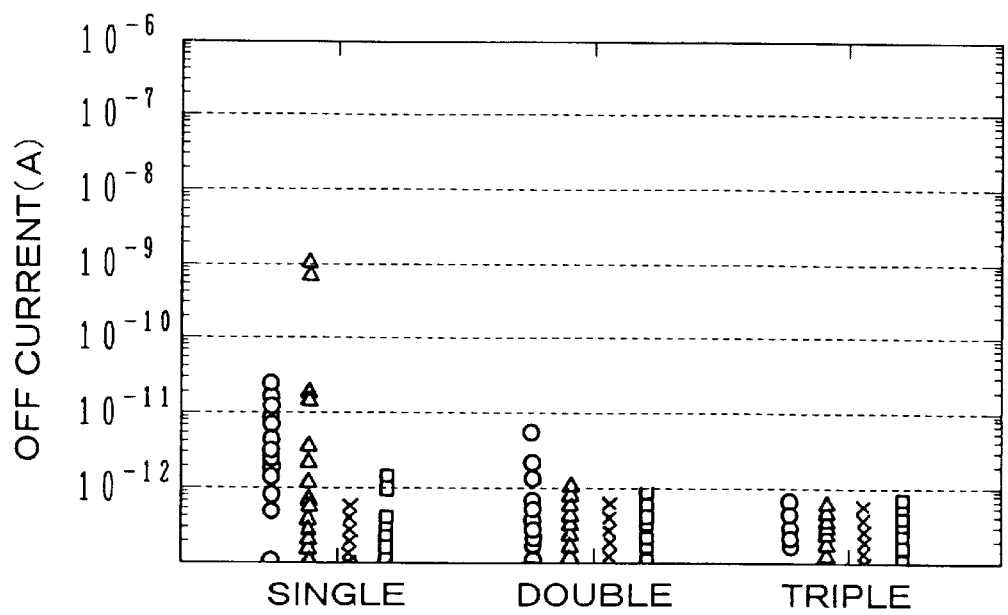

FIG. 3A is a graph showing the on-current of each TFT, and FIG. 3B is a graph showing the off-current of each TFT. The measurement conditions of the on-current were a gate voltage of 10 V and a drain voltage of 1 V, and the measurement conditions of the off-current were a gate voltage of −10 V and a drain voltage of 1 V. The abscissa of FIGS. 3A and 3B represents single-gate TFTs, double-gate TFTs and triple-gate TFTs sequentially in this order from left. In FIGS. 3A and 3B, a circle symbol represents a TFT without the LDD structure, a triangle symbol represents a TFT having a one-side LDD structure with the LDD region only on the source side shown in FIGS. 4A, 4D and 4G. A cross symbol represents a TFT having a one-side LDD structure with the LDD region only on the drain side shown in FIGS. 4B, 4E and 4H. A square symbol represents a TFT having a both-side LDD structure with the LDD region on both the source and drain sides shown in FIGS. 4C, 4F and 4I.

Although TFTs having the both-side LDD structure can reduce the off-current more than TFTs having no LDD structure as indicated by the square symbols in FIG. 3B, the on-current also reduces as indicated by the circle symbols in FIG. 3A.

Although TFTs having no LDD structure can obtain a larger on-current than TFTs having the both-side LDD structure as indicated by the circle symbols in FIG. 3A, the off-current increases as shown in FIG. 3B.

TFTs having the one-side LDD structure with the double-gate or triple-gate can obtain an on-current not so smaller than TFTs having no LDD structure, and an off-current not so larger than TFTs having the both-side LDD structure.

TFT having a single gate and the one-side LDD structure has the LDD structure only on one side of the gate. In forming the LDD structure only on one side of the gate, in the process shown in FIG. 2C, the resist pattern 30 covers only one side of the gate bus line 1. Therefore, as the gate length becomes short and the gate bus line 1 becomes narrow, a high alignment precision is required.

In contrast, TFT having double gates or triple gates and the one-side LDD structure has the LDD structure on both sides of one of the gates. Therefore, even if the gate length becomes short, a high alignment precision in forming the LDD structure is not required. Manufacture yield can be prevented from being lowered by misalignment.

As shown in FIGS. 4D, 4E, 4G and 4H, the both-side LDD structure on the source or drain side having double gates or triple gates can realize a large on-current and a small off-current and can improve manufacture yield.

In FIGS. 4D to 4I, one gate bus line is branched and each branch crosses the current path pattern between the source and drain. Instead, as shown in FIG. 1, the gate bus line 1 may be disposed linearly and the current path pattern 3 is bent to make the gate bus line 1 and current path pattern 3 cross twice.

Figure 5:
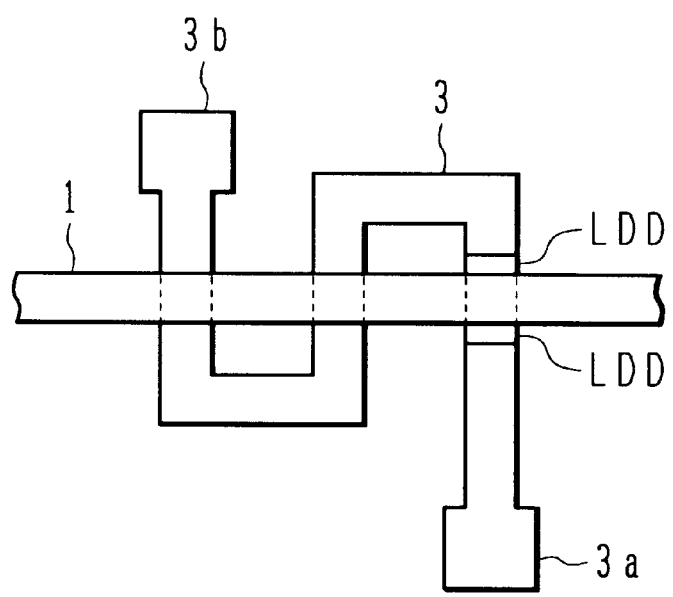
FIG. 5 is a plan view showing another example of the structure of a multi-gate TFT.

FIG. 5 shows another example of the structure of a gate bus line and a current path pattern. A gate bus line 1 is disposed linearly and a current path pattern 3 is bent in an S-character shape, and both cross in three areas. Of these three cross areas, the cross area on the side of an end portion 3a connected to a drain bus line is formed with the LDD structure on both sides thereof. The current path pattern 3 may be formed linearly and the gate bus line 1 is bent to make both cross each other in a plurality of cross areas.

Next, with reference to FIGS. 6 and 7, a liquid crystal display substrate according to the second embodiment will be described.

Figure 6:
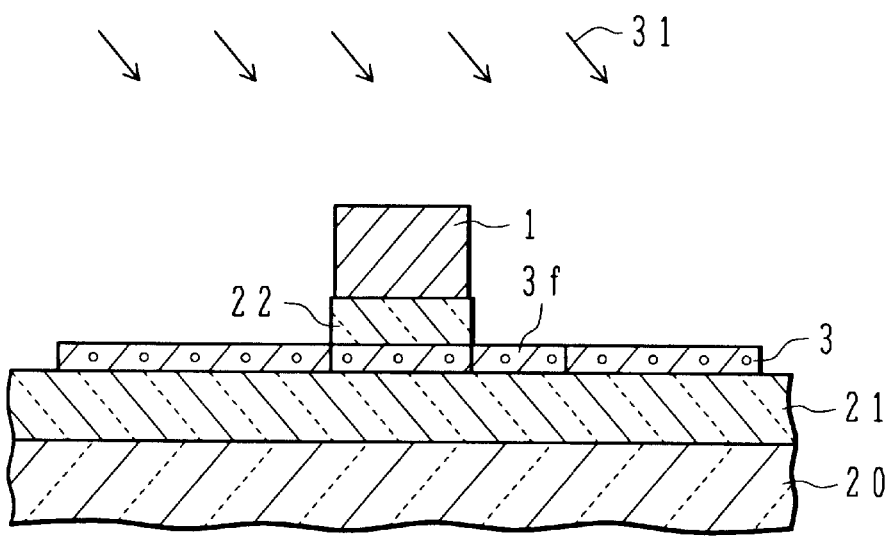
FIG. 6 is a cross sectional view of a TFT used in a liquid crystal display substrate according to a second embodiment.

FIG. 6 is a cross sectional view of a TFT used with the liquid crystal display substrate of the second embodiment. The principal surface of a glass substrate 20 has an underlie $SiO_2$ film 21 formed thereon. A partial surface area of the underlie $SiO_2$ film has a current path pattern 3 of polysilicon formed therein. The gate bus line 1 three-dimensionally crosses the current path pattern 3. A gate insulating film 22 is disposed between the gate bus line 1 and current path pattern 3. This structure is formed by the same processes as the processes up to the process of forming the gate bus line shown in FIG. 2C of the first embodiment.

Next, by using the gate bus line 1 as a mask, phosphorous ions are doped. The phosphorous ion doping conditions are the same as the conditions of the second phosphorous ion doping described with FIG. 2C of the first embodiment.

After phosphorous ions are doped, a laser beam 31 is applied obliquely relative to the substrate surface to activate doped phosphorous ions. The laser used is a XeCl excimer laser and the energy density is 200 to 300 $mJ/cm^2$. The incidence plane of the laser beam 31 is perpendicular to the extension direction of the gate bus line 1. In this case, the laser beam does not reach a portion of the current path pattern 3 shaded by the gate bus line 1. Therefore, a region 3f in which phosphorous ions are not activated is left on one side of the gate bus line. This region 3f with phosphorous ions not activated serves as the low concentration region of the LDD structure.

As described earlier, by the annealing with an obliquely irradiated laser beam, the low concentration region of the LDD structure can be formed in self-alignment with the gate bus line.

Figure 7:
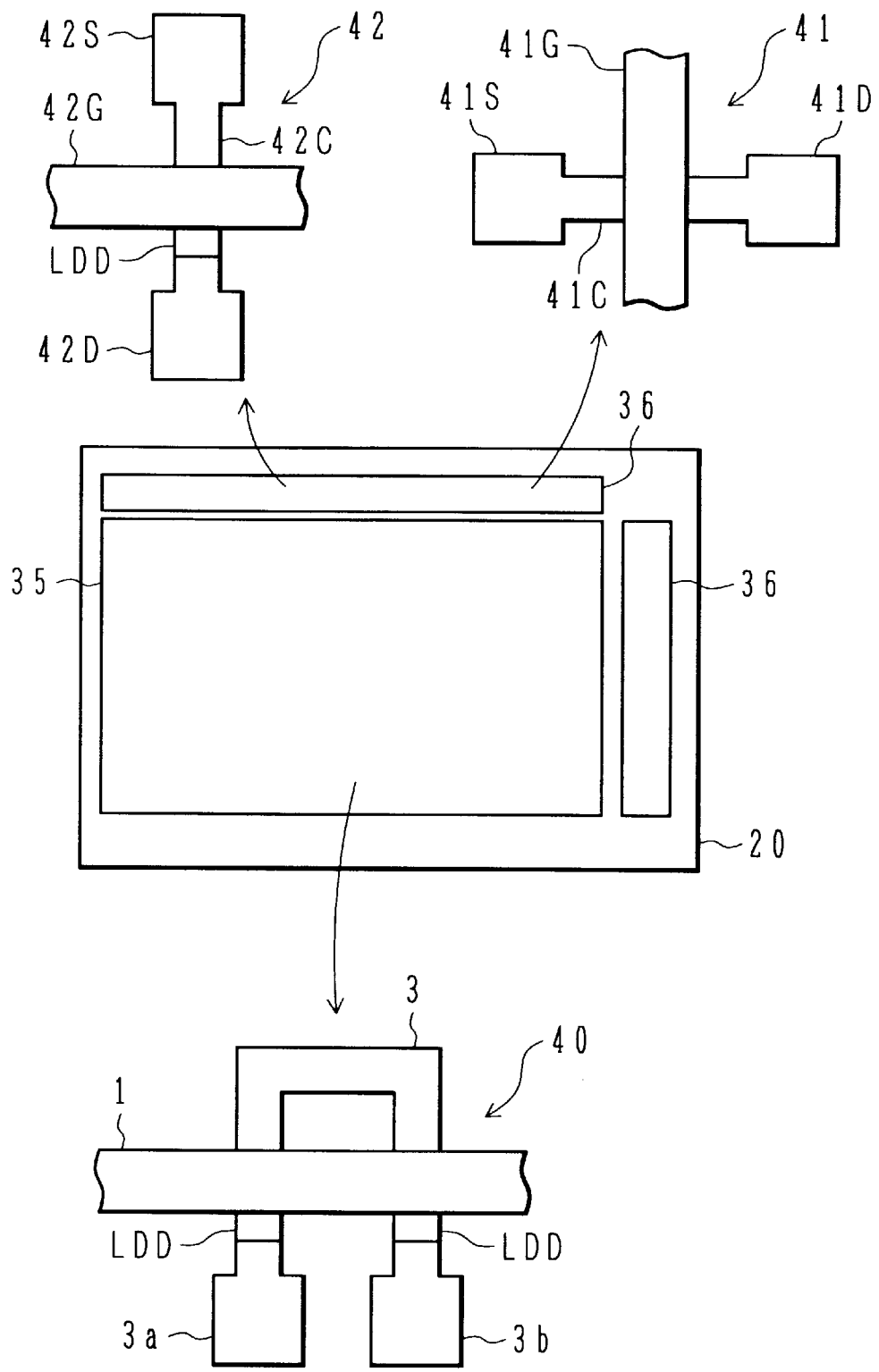
FIG. 7 is a schematic plan view of the liquid crystal display substrate of the second embodiment, and enlarged plan views of TFTs.

FIG. 7 is a schematic plan view of the liquid crystal display substrate of the second embodiment, and enlarged plan views of TFTs. An image display area 35 is defined on a principal surface of the glass substrate 20. A peripheral circuit area 36 is defined in upper and right side areas of the image display area 35. In the image display area 35, gate bus lines 1 and drain bus lines 2 such as shown in FIG. 1 are disposed in a lattice shape, and pixel electrodes 5 are disposed in a matrix shape. In the peripheral circuit area 36, a peripheral circuit is disposed for applying drive signals to the gate bus lines 1 and drain bus lines 2.

A TFT 40 in the image display area 35 is constituted of the current path pattern 3, an end portion 3a on the drain side, an end portion 3b on the source side, and the gate bus line 1. The end portion 3a of the drain side is connected to the drain bus line 2, and the end portion 3b on the source side is connected to the pixel electrode 5. The current path pattern 3 has a U-character bent shape and includes a portion in which current flows in the column direction (vertical direction in FIG. 7). The gate bus line 1 extends in the row direction (horizontal direction in FIG. 7) and crosses the column directionally flowing current portion in two cross areas. The end portion 3a on the drain side and the end portion 3b on the source side are disposed in an area lower than the gate bus line 1 as viewed in FIG. 7.

A p-channel type TFT 41 in the peripheral circuit area 36 is constituted of a current path pattern 41C, an end portion 41S on the source side, an end portion 41D on the drain side, and a gate electrode 41G. The current path pattern 41C includes a portion in which current flows in the row direction. The gate electrode 41G extends in the row direction and crosses the column directionally flowing current portion of the current path pattern 41C.

An n-channel type TFT 42 is constituted of a current path pattern 42C, an end portion 42S on the source side, an end portion 42D on the drain side, and a gate electrode 42G. The current path pattern 42C includes a portion in which current flows in the column direction. The gate electrode 42G extends in the row direction and crosses the column directionally flowing current portion of the current path pattern 42C.

TFT 40 has the LDD structure only in the area lower than the gate bus line 1 as viewed in FIG. 7. TFT 42 also has the LDD structure only in the area lower than the gate electrode 42G. TFT 41 has no LDD structure.

Such LDD structure can be formed by obliquely applying a laser as described with FIG. 6 to activate impurity ions. In forming the liquid crystal display substrate of the second embodiment shown in FIG. 7, the optical axis of a laser beam is inclined so as to shade the area lower than the gate bus line 1 as viewed in FIG. 7. Since the gate electrode 42G of TFT 42 is disposed in parallel to the gate bus line 1, the shaded area is formed in an area lower than the gate electrode 42G as viewed in FIG. 7. Since the gate electrode 41G of TFT 41 is in parallel to the incidence plane of a laser beam, this beam is applied to the areas on both sides of the gate electrode and no shaded area is formed.

TFT 40 in the image display area 35 has the double-gate structure and the LDD structure on the source side of the gate near the source and on the drain side of the gate near the drain. Therefore, as compared to a TFT with no LDD structure, the off-current can be reduced more. In the peripheral circuit area, desired TFTs are provided with the one side LDD structure, and other TFTs are not provided with the LDD structure. For example, n-channel type TFTs are provided with the one-side LDD structure and p-channel type TFTs are not provided with the LDD structure. In this manner, the reliability of n-channel type TFTs can be improved and the on-current of p-channel type TFTs can be prevented from being lowered.

In the manufacture of the liquid crystal display substrate shown in FIG. 7, the LDD structure is formed in a desired area by obliquely applying a laser beam. Since a photography process for the LDD structure is not necessary, the number of processes can be prevented from being increased.

Although single-gate type TFTs and double-gate type TFTs have been described with reference to FIG. 7, the method of activating impurity ions by obliquely applying a laser beam described with FIG. 6 is also applicable to TFTs having triple gates or more gates.

Figure 8A:
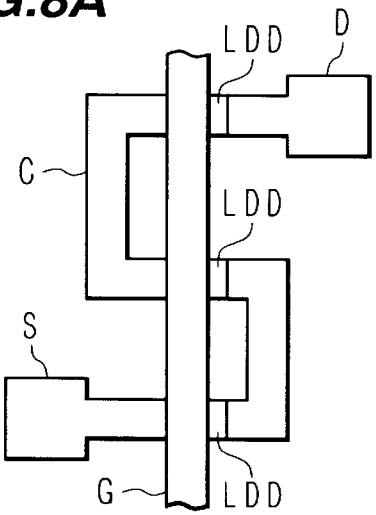
FIGS. 8A to 8E are plan views showing other examples of the structure of a multi-gate TFT.

FIG. 8A is a schematic plan view showing a triple-gate type TFT formed by using the method of obliquely applying a laser beam. This TFT is constituted of a current path pattern C, a source side end portion S, a drain side end portion D, and a gate electrode G. The current path pattern C has an S-character bent shape. The gate electrode G crosses the current path pattern C in three cross areas. In each cross area, a low concentration area LDD of the LDD structure is formed only on one side of the gate electrode.

In TFT shown in FIG. 8A, the current path pattern C is bent and the gate electrode G is straight. The current path pattern may be made straight, and the gate electrode may be branched to form a multi-gate type TFT.

Figure 8B:
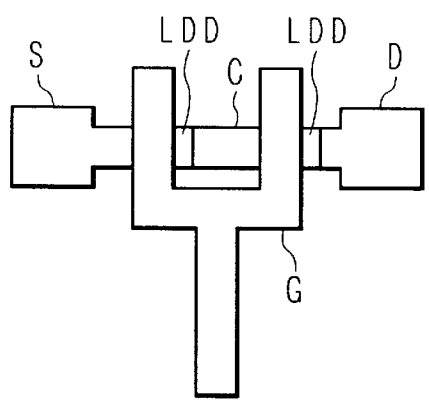

FIG. 8B shows a double-gate type TFT with a gate electrode G having two branches. The gate electrode G is branched into two branches. Each of the branched two gate electrodes crosses the current path pattern C. In each cross area, a low concentration area LDD of the LDD structure is formed only on the drain side of the gate electrode.

Figure 8C:
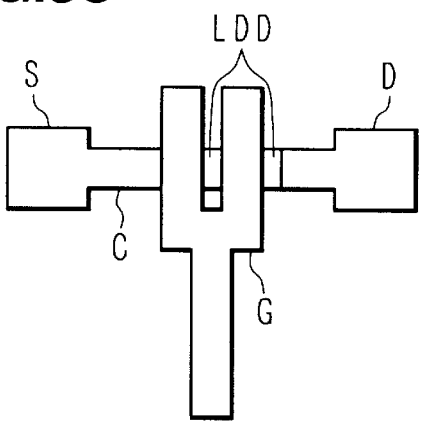

FIG. 8C shows a TFT having a narrow gap between two branched gate electrodes. A low concentration region LDD formed on one side in one cross area reaches the border of the gate electrode G in the other cross area. The LDD structure is formed on both sides of the gate electrode in one cross area. By properly setting the incidence angle of a an irradiated laser beam and the gap between the branched gate electrodes, the LDD structure can be formed on both sides in one cross area. The LDD structures on both sides of a channel layer can suppress a variation in element characteristics when the polarity of voltage applied to TFT is inverted.

Figure 8D:
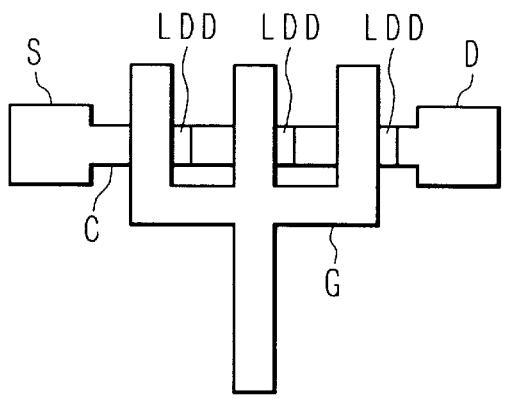
Figure 8E:
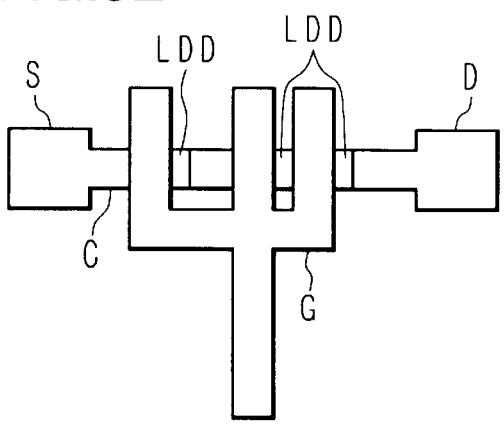

FIG. 8D is a schematic plan view of a triple-gate type TFT with the gate electrode G branched into three branches. In each cross area between the branched gate electrodes G and a current path pattern C, the LDD structure is formed on the drain side of the gate electrode G. As shown in FIG. 8E, a gap between the two branched gate electrodes G of the three branched gate electrodes G may be narrowed to form the LDD structure on both side in one cross area.

Next, with reference to FIGS. 9A to 9E, the third embodiment will be described. In the first embodiment, the end of the low concentration region 3d on the channel layer side is aligned with the border of the gate bus line 1, and the end of the low concentration region 3d on the high concentration region 3e side is aligned with the border of the gate insulating film 22a. Namely, both ends of the low concentration region 3d are defined by the photolithography processes. In the third embodiment to be described hereinunder, only one end of the low concentration region is defined by the photolithography process.

Figure 9A:
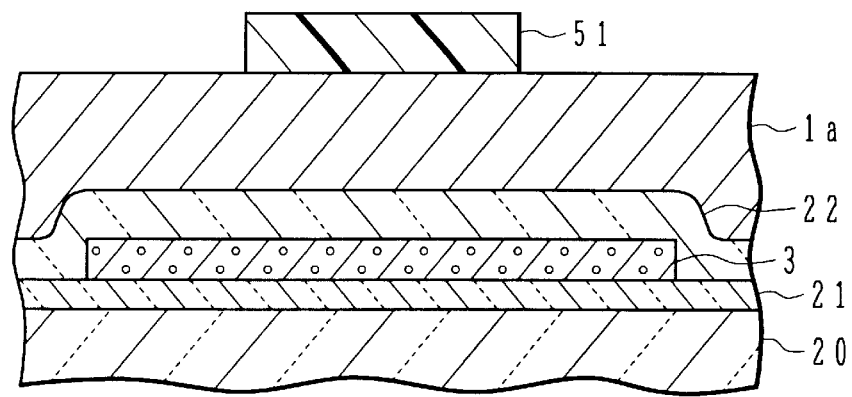
FIGS. 9A to 9E are cross sectional views of a substrate illustrating a method of manufacturing TFTs according to a third embodiment.

As shown in FIG. 9A, an underlie $SiO_2$ film 21 is formed to a thickness of 200 nm on the surface of a glass substrate 20. On this underlie $SiO_2$ film 21, a current path pattern 3 of polysilicon is formed to a thickness of 50 nm. A gate insulating film 22 of $SiO_2$ is formed to a thickness of 120 nm on the underlie $SiO_2$ film 21, covering the current path pattern 3. The processes up to this are similar to those processes of forming the structure shown in FIG. 2B of the first embodiment.

A conductive film 1a of AlSc alloy is deposited to a thickness of 300 nm on the gate insulating film 22 by sputtering. On this conductive film 1a, a resist pattern 51 having a plan shape corresponding to the gate bus line 1 shown in FIG. 1 is formed.

Figure 9B:
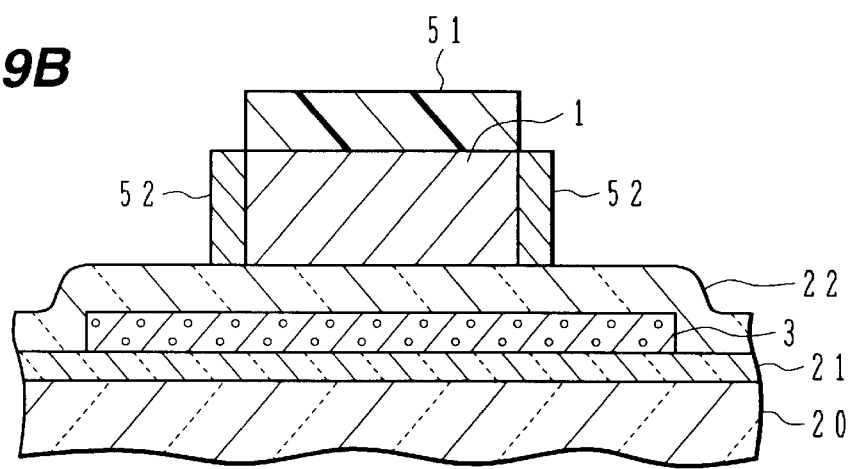

As shown in FIG. 9B, by using the resist pattern 51 as a mask, the conductive film 1a is etched. This etching is performed by using a two-frequency plasma etching system. For example, in this two-frequency plasma etching system, a voltage having a frequency of 4 MHz is applied via a capacitor to a substrate holder on which a substrate to be etched is placed, and an a.c. magnetic field having a frequency of 13.56 MHz is generated in the upper space of the substrate by using a coil. As etching gas, mixture gas of chlorine ($Cl_2$) and $BCl_3$ is used. For example, the flow rate of chlorine gas is set to 30 sccm, the flow rate of $BCl_3$ gas is set to 150 sccm, a pressure in the chamber is set to 8 Pa, and a power supplied to the coil is set to 1 kW.

It is preferable to make the power supplied to the coil at the frequency of 13.56 MHz be set larger than the power supplied to the substrate holder at the frequency of 4 MHz. By adjusting the powers in this manner, the ion impact effects can be reduced and a chemical reaction becomes dominant. Side wall additive 52 becomes, therefore, likely to be formed. Instead of generating the magnetic field in the upper space of the substrate by using the coil, a high frequency electric field may be generated by using plate electrodes. More generally, it is preferable to adjust powers so that the power supplied to a high frequency electric power supply means (corresponding to the coil or plate electrodes) disposed above the substrate is larger than the power supplied to another high frequency power supply means (corresponding to the substrate holder) disposed under the substrate.

With this etching, the conductive film 1a is patterned inheriting the shape of the resist pattern 51, to leave a gate bus line 1. The side wall additive 52 is also formed because reaction byproducts of AlSc material of the conductive film 1a and material of the resist pattern 51 reacted with etching gas are attached to the side walls of the gate bus line 1. Under the above-described etching conditions, the thickness of the side wall additive 52 is about 100 nm. As the etching gas, instead of $BCl_3$, gas such as $SiCl_4$, HBr, Hi, $N_2$, $CF_4$ and HCl may be used. As the material of the conductive film 1a, instead of AlSc, other material such as Al, AlTi, AlNd and AlCu may be used.

Figure 9C:
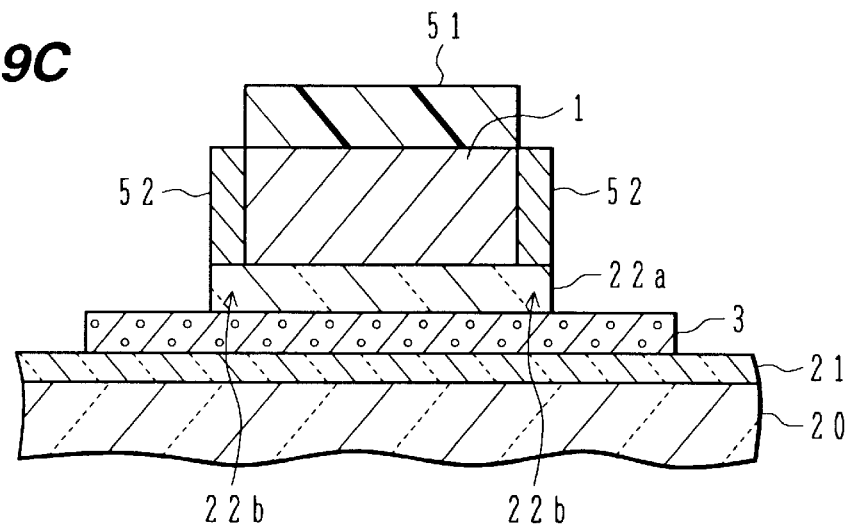

As shown in FIG. 9C, by using as a mask the gate bus line 1 (or resist pattern 51) and side wall additive 52, the gate insulating film 22 is etched to leave a patterned gate insulating film 22a. The gate insulating film 22a has projection areas 22b outward projecting on both sides of the gate bus line 1 by an amount corresponding to the thickness of the side wall additive 52. This etching is executed by using the two-frequency plasma etching system. As the etching gas, mixture gas of $CF_4$ and $CHF_3$ is used. For example, the flow rates of $CH_4$ gas and $CHF_3$ gas are both set to 50 sccm, the pressure in the chamber is set to 4 Pa and the power supplied to the coil is set to 1 kW. It is preferable to make the power supplied to the substrate holder under the substrate be set larger than the power supplied to the coil above the substrate. By adjusting the powers in this manner, the ion impact effects can be enhanced and etching with high anisotropy can be executed. More generally, it is preferable to adjust supply powers so that the power supplied to a high frequency power supply means (corresponding to the substrate holder) disposed under the substrate is larger than the power supplied to another high frequency electric power supply means (corresponding to the coil).

Figure 9D:
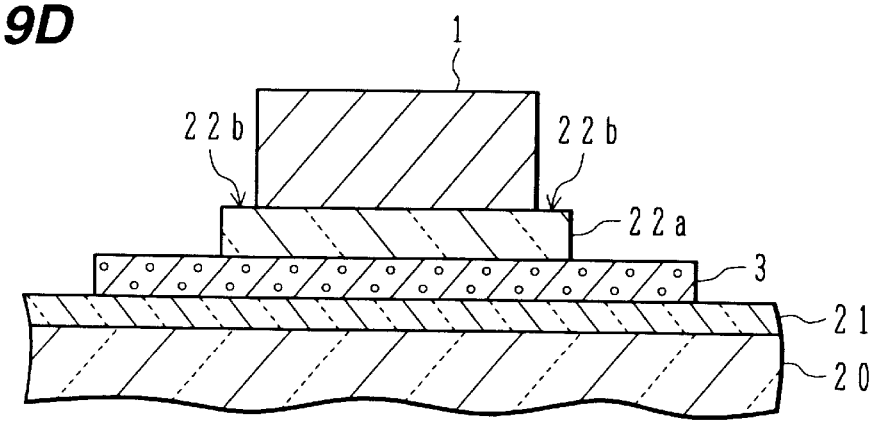

As shown in FIG. 9D, the resist pattern 51 and side wall additive 52 are removed. This removal can be effected by a wet process using phenol containing remover and amine containing organic solvent.

Figure 9E:
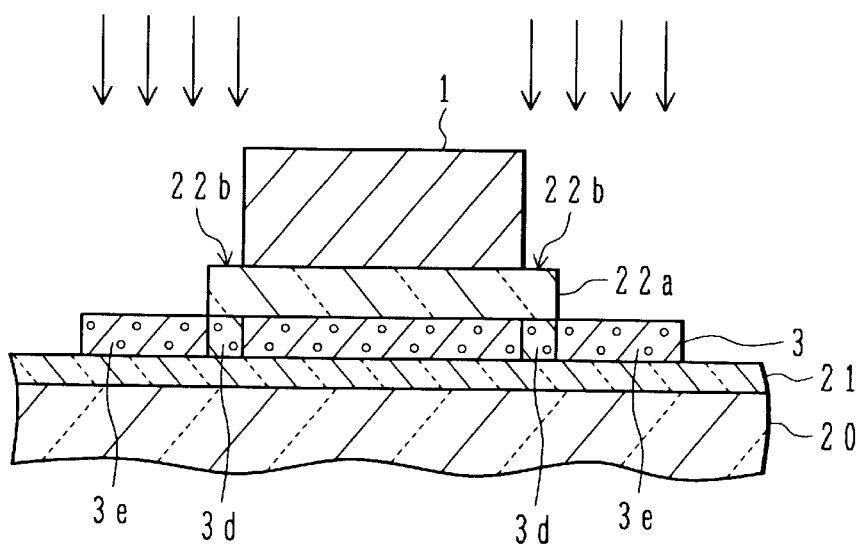

As shown in FIG. 9E, by using the gate bus line 1 as a mask, impurity ions are implanted into the current path pattern 3 under the conditions allowing impurity ions to transmit through the projection areas 22b. More specifically, in the area where n-channel TFTs are formed, $PH_3$ ions are implanted under the conditions of an acceleration energy of 50 keV and a dose of $5\times10^{15}$ $cm^{-2}$, and in the area where p-channel TFTs are formed, $BF_2$ ions are implanted under the conditions of an acceleration energy of 50 keV and a dose of $5\times10^{15}$ $cm^{-2}$.

With the ion implantation under these conditions, the impurity concentration of a region of the current path pattern 3 under the projection areas 22b becomes lower than that of the exposed region. Therefore, low concentration regions 3d are formed under the projection areas 22b and high concentration regions 3e are formed outside of the low concentration regions 3d.

The boundary between the low concentration region 3d and channel layer is defined by the border of the gate bus line 1, and the boundary between the low concentration region 3d and high concentration region 3e is defined by the border of the gate insulating film 22a. Since the border of the gate insulating film 22a is determined by the side wall of the side wall additive 52 shown in FIG. 9B, the boundary between the low concentration region 3d and high concentration region 3e is determined in a self-alignment manner relative to the gate bus line 1.

The length of the low concentration region 3d is determined by the thickness of the side wall additive 52. This thickness depends upon the etching conditions for the conductive film 1a described with reference to FIG. 9B. Therefore, by controlling the etching conditions, the length of the low concentration region 3d can be adjusted.

A method of forming the LDD structure in the cross area 10 shown in FIG. 1 has been described with reference to FIGS. 9A to 9E. With this method, however, the LDD structure is formed also in the cross area 11. In order not to form the LDD structure in the cross area 11, the projection areas 22b in the cross area 11 are removed prior to the ion implantation process described with reference to FIG. 9E. This removal can be executed by RIE using mixture gas of $CF_4$ and $CHF_3$ by using a resist mask having an opening exposing the cross area 11 and nearby area.

In the first embodiment, the LDD structure and non-LDD structure are used in combination. If TFTs having only the LDD structure are to be formed on a glass substrate, it is not necessary to remove the projection areas 22b.

Next, with reference to FIGS. 10A and 10B, the fourth embodiment will be described. In the third embodiment, the LDD structure is formed for TFTs. This LDD structure forming method may be applied to MISFETs on a silicon single crystal substrate. In the fourth embodiment, MISFETs are formed on a silicon single crystal substrate.

Figure 10A:
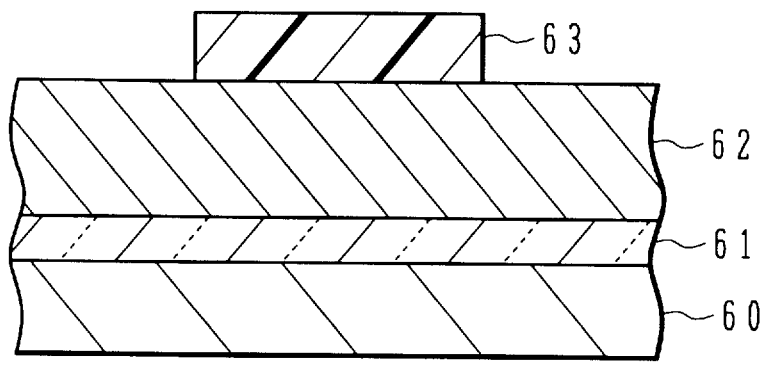
FIGS. 10A and 10B are cross sectional views of a substrate illustrating a method of manufacturing TFTs according to a fourth embodiment.

The cross sectional view of a substrate during the manufacture processes shown in FIG. 10A corresponds to FIG. 9A referred to for the description of the third embodiment. The current pattern 3 shown in FIG. 9A is replaced by an active region 60 of a single crystal silicon substrate shown in FIG. 10A, the gate insulating film 22 is replaced by a silicon oxide film 61 formed on the active region 60, the conductive film 1a is replaced by a conductive film 62, and the resist pattern 51 is replaced by a resist pattern 63.

Figure 10B:
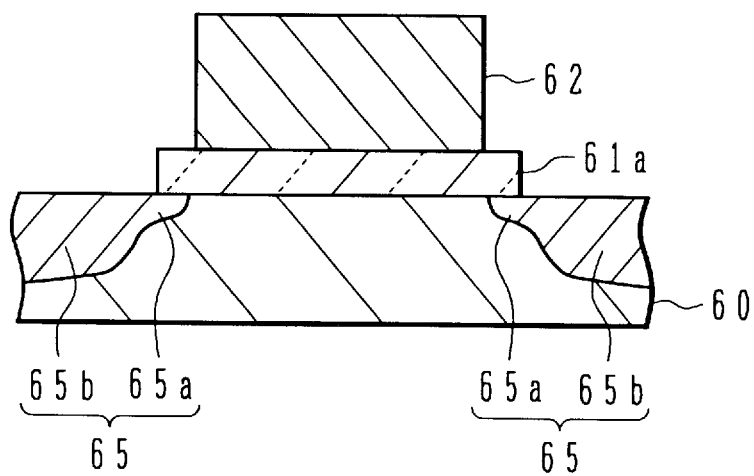

As the processes similar to those shown in FIGS. 9B to 9E of the third embodiment are executed, a MISFET shown in FIG. 10B is obtained. This MISFET is constituted of source and drain regions 65, a gate insulating film 61a made of silicon oxide, and a gate electrode 62 made of AlSc alloy. Each of the source and drain regions 65 has the LDD structure including a low concentration region 65a and a high concentration region 65b.

According to a conventional MISFET manufacture method, an ion implantation process of forming a low concentration region and an ion implantation process of forming a high concentration region are executed independently. With the fourth embodiment method, both the low and high concentration regions can be formed by one ion implantation process.

The present invention has been described in connection with the preferred embodiments. The invention is not limited only to the above embodiments. It is apparent that various modifications, improvements, combinations, and the like can be made by those skilled in the art.

What is claimed is:

1. A liquid crystal display substrate comprising:

a substrate on which an image display area and a peripheral circuit area are defined, the peripheral circuit area being disposed at a side of the image display area;

a plurality of gate bus lines extending in a row direction and formed on the substrate in the image display area;

a plurality of drain bus lines extending in a column direction and formed on the substrate in the image display area, said drain bus lines being electrically insulated from said gate bus lines in cross areas in which said drain bus lines cross with said gate bus lines;

pixel electrodes positioned between cross areas in which said drain bus lines cross with said gate bus lines;

first thin film transistors associated with the cross areas in which said drain bus lines cross with said gate bus lines, each of said first thin film transistors connecting corresponding drain bus line and pixel electrode, each of said first thin film transistors including a channel region for flowing current in a first direction, a first impurity doped region having a first impurity concentration, and a second impurity doped region having a second impurity concentration higher than the first impurity concentration, said first impurity doped region and said second impurity doped region sandwiching said channel region, current flowing in the channel region being controlled by a corresponding gate bus line, and the first impurity doped region being electrically connected to a corresponding one of said drain bus lines; and a second thin film transistor formed on the substrate in the peripheral circuit area and including a channel region for flowing current in a second direction perpendicular to the first direction, and third impurity doped regions having a third impurity concentration and disposed on both sides of the channel region.

2. A liquid crystal display substrate according to claim 1, further comprising:

a third thin film transistor formed on the substrate in the peripheral circuit area and including a channel region for flowing current in the first direction, a fourth impurity doped region having a fourth impurity concentration, and a fifth impurity doped region having a fifth impurity concentration higher than the fourth impurity concentration, said fourth impurity doped region and fifth impurity doped region sandwiching said channel region;

wherein said first and third thin film transistors are n-channel transistors and said second thin film transistor is a p-channel transistor.

3. A liquid crystal display substrate according to claim 1, wherein the first impurity doped region and the second impurity doped region are in contact with the channel region of the first thin film transistor.

4. A liquid crystal display substrate according to claim 2, wherein the first impurity doped region and the second impurity doped region are in contact with the channel region of the first thin film transistor.

* * * * *

UNITED STATES PATENT AND TRADEMARK OFFICE
CERTIFICATE OF CORRECTION

PATENT NO.    : 6,628,349 B1
DATED         : March 4, 2003
INVENTOR(S)   : Patel et al.

It is certified that error appears in the above-identified patent and that said Letters Patent is hereby corrected as shown below:

The title page showing the illustrative figure should be replaced with the attached title page.

(12) United States Patent
Patel et al.

(10) Patent No.: US 6,528,349 B1
(45) Date of Patent: Mar. 4, 2003

(54) MONOLITHICALLY-FABRICATED COMPLIANT WAFER-LEVEL PACKAGE WITH WAFER LEVEL RELIABILITY AND FUNCTIONALITY TESTABILITY

(75) Inventors: Chirag S. Patel, Peekskill, NY (US); Kevin Martin, Atlanta, GA (US); James D. Meindl, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/697,031

(22) Filed: Oct. 26, 2000

Related U.S. Application Data
(60) Provisional application No. 60/161,437, filed on Oct. 26, 1999.

(51) Int. Cl.[7] .................. H01L 21/44; H01L 21/48; H01L 21/50
(52) U.S. Cl. .................. 438/117; 438/15; 438/106; 438/108; 438/117; 438/612; 438/613; 438/623; 438/624; 438/640
(58) Field of Search ................ 438/15, 612, 106, 438/613, 108, 623, 117, 624, 640

(56) References Cited

U.S. PATENT DOCUMENTS

| | | | | |
|---|---|---|---|---|
| 5,023,205 A | * | 6/1991 | Reche | 437/228 |
| 5,736,448 A | * | 4/1998 | Saia et al. | 438/393 |
| 6,187,615 B1 | * | 2/2001 | Kim et al. | 438/113 |
| 6,281,111 B1 | * | 8/2001 | Ohsumi | 438/623 |

OTHER PUBLICATIONS

Reed et al., Compliant Wafer Level Package (CWLP) With Embedded Air–gaps for Sea of Leads (SoL) Interconnections, School of Chemical Engineering, Georgia Institute of Technology, pp. 1–3.

Patel et al., Thermal Management in High Density 'Tiled' Compliant Wafer Level Packages, Microelectronics Research Center, Georgia Institute of Technology, pp. 1–21.

Patel et al., Optimal Printed Wiring Board Design For High I/O Density Chip Size Packages, Microelectronics Research Center, Georgia Institute of Technology, pp. 1–5.

Patel et al., Low Cost High Density Complaint Wafer Level Package, 2000 International Conf. on High–Density Interconnect and Systems Packaging, Apr. 26–28, 2000, Denver, Colorado, pp. 1–8.

Patel et al., Analysis of Thermal Management in the System Assembly of High Density Chip Size Packages, Microelectronics Research Center, Georgia Institute of Technology, pp. 32–39.

Patel et al., Reliability and Thermo–Mechanical Analysis of Complaint Wafer Level Package, Microelectronics Research Center, Georgia Institute of Technology, pp. 1–5.

(List continued on next page.)

Primary Examiner—Albert W. Paladini
Assistant Examiner—David A. Zarneke
(74) Attorney, Agent, or Firm—Thomas, Kayden, Horstemeyer & Risley, LLP

(57) ABSTRACT

Compliant wafer level packages 10 and methods for monolithically fabricating the same. A monolithically fabricated compliant wafer level package 10 having a compliant layer 14 and a compliant interconnect 30 passing therein. The compliant interconnects 30 being provided so that electrical and mechanical connections may be supported across the compliant layer 14, and constructed so that stresses related to relative motion between electrical components is accommodated. A method of providing a substrate 10 having a compliant layer 14, the compliant layer 14 having a via 20 that exposes a die pad 12 on the substrate 10. Fabricating a compliant interconnect 30 so that the compliant interconnect 30 contacts the die pad 12. The compliant interconnect 30 constructed so that electrical and mechanical connections may be supported through the compliant layer 14.

21 Claims, 7 Drawing Sheets-

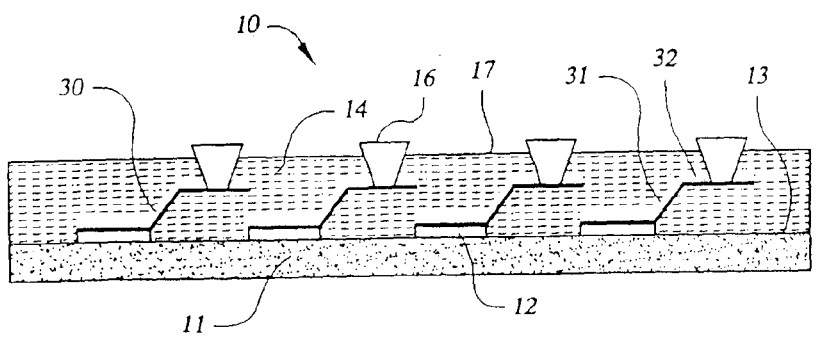

UNITED STATES PATENT AND TRADEMARK OFFICE
CERTIFICATE OF CORRECTION

PATENT NO. : 6,628,349 B1
DATED : March 4, 2003
INVENTOR(S) : Patel et al.

It is certified that error appears in the above-identified patent and that said Letters Patent is hereby corrected as shown below:

Drawings,
Replace FIGs. 1-2C with the following:

FIG.1

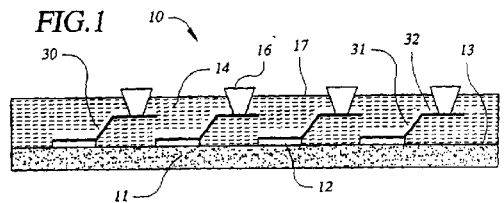

FIG.2A

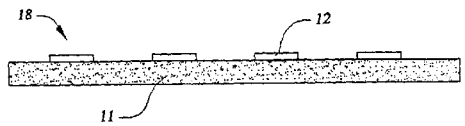

FIG.2B

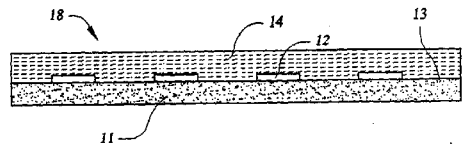

FIG.2C

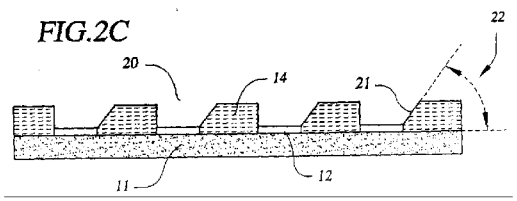

UNITED STATES PATENT AND TRADEMARK OFFICE
CERTIFICATE OF CORRECTION

PATENT NO. : 6,628,349 B1
DATED : March 4, 2003
INVENTOR(S) : Patel et al.

It is certified that error appears in the above-identified patent and that said Letters Patent is hereby corrected as shown below:

Drawings, (cont.)
Replace FIGs. 2D-2G with the following:

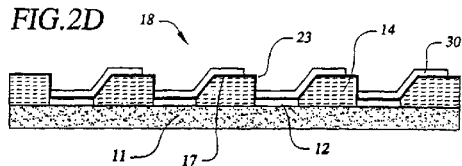

FIG.2D

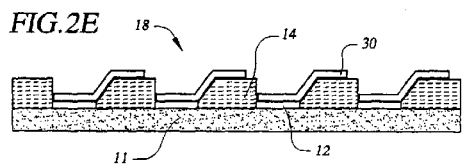

FIG.2E

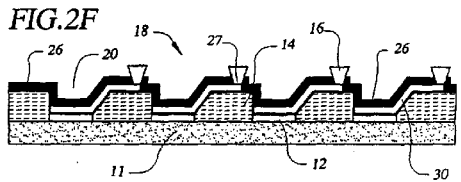

FIG.2F

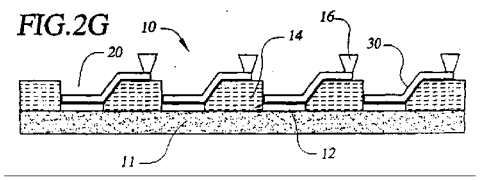

FIG.2G

UNITED STATES PATENT AND TRADEMARK OFFICE
CERTIFICATE OF CORRECTION

PATENT NO. : 6,628,349 B1
DATED : March 4, 2003
INVENTOR(S) : Patel et al.

It is certified that error appears in the above-identified patent and that said Letters Patent is hereby corrected as shown below:

<u>Drawings, (cont.)</u>
Replace FIGs. 2H-2I with the following:

*FIG.2H*

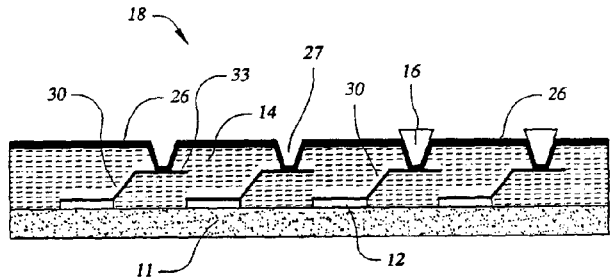

*FIG.2I*

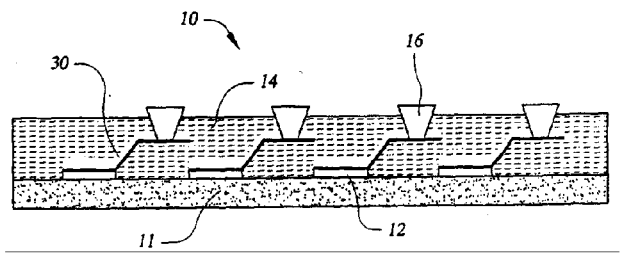

UNITED STATES PATENT AND TRADEMARK OFFICE
CERTIFICATE OF CORRECTION

PATENT NO.    : 6,628,349 B1  
DATED         : March 4, 2003  
INVENTOR(S)   : Patel et al.

Page 6 of 8

It is certified that error appears in the above-identified patent and that said Letters Patent is hereby corrected as shown below:

<u>Drawings, (cont.)</u>
Replace FIGs. 3A-3B with the following:

FIG.3A

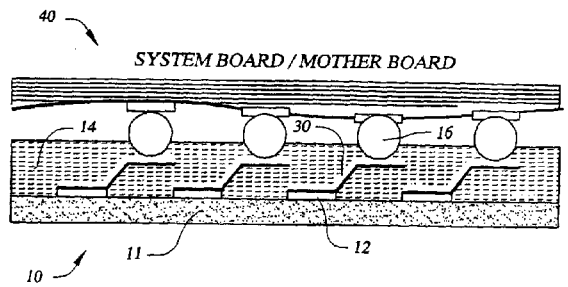

FIG.3B

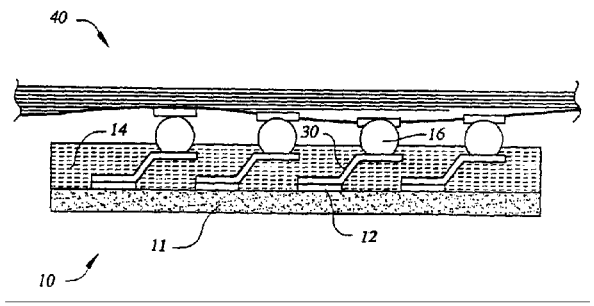

UNITED STATES PATENT AND TRADEMARK OFFICE
CERTIFICATE OF CORRECTION

PATENT NO. : 6,628,349 B1
DATED : March 4, 2003
INVENTOR(S) : Patel et al.

It is certified that error appears in the above-identified patent and that said Letters Patent is hereby corrected as shown below:

Drawings, (cont.)
Replace FIGs. 4A-4B with the following:

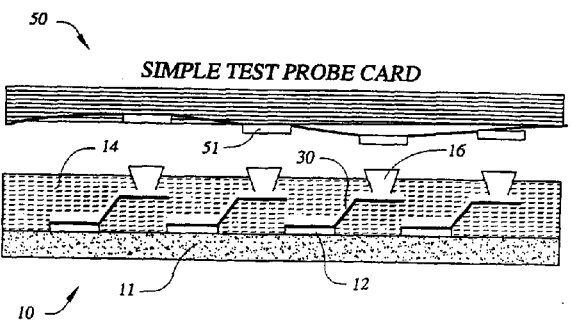

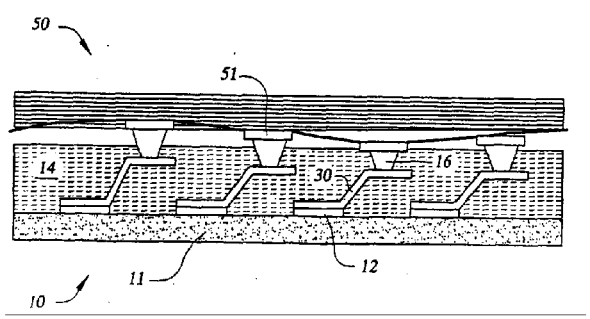

UNITED STATES PATENT AND TRADEMARK OFFICE
CERTIFICATE OF CORRECTION

PATENT NO. : 6,628,349 B1
DATED : March 4, 2003
INVENTOR(S) : Patel et al.

Page 8 of 8

It is certified that error appears in the above-identified patent and that said Letters Patent is hereby corrected as shown below:

Drawings, (cont.)
Replace FIGs. 5-6G with the following:

*FIG.5*

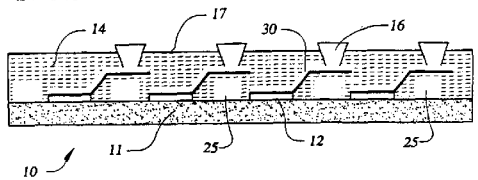

*FIG.6A*  *FIG.6B*

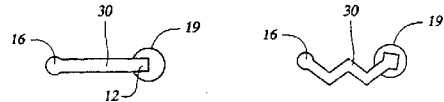

*FIG.6C*  *FIG.6D*

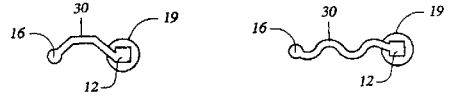

*FIG.6E*  *FIG.6F*

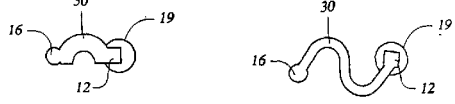

*FIG.6G*

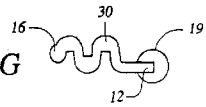

Signed and Sealed this

Ninth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,628,349 B1
DATED         : September 30, 2003
INVENTOR(S)   : Takei et al.

It is certified that error appears in the above-identified patent and that said Letters Patent is hereby corrected as shown below:

<u>Title page,</u>
Item [75], Inventors, delete "Kohta Yoshikawa".

Signed and Sealed this

Sixteenth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,628,349 B1
DATED : September 30, 2003
INVENTOR(S) : Michiko Takei et al.

It is certified that error appears in the above-identified patent and that said Letters Patent is hereby corrected as shown below:

This certificate supersedes Certificate of Correction issued March 16, 2004, the number was erroneously mentioned and should be vacated since no Certificate of Correction was granted.

Signed and Sealed this

Twenty-second Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,628,349 B1  Page 1 of 1
DATED : September 30, 2003
INVENTOR(S) : Michiko Takei et al.

It is certified that error appears in the above-identified patent and that said Letters Patent is hereby corrected as shown below:

This certificate supersedes the Certificate of Correction issued on March 9, 2004 and the supersede Certificate of Correction issued on June 22, 2004. The Certificate of Correction issued on March 16, 2004 deleting an inventor is correctly stated and shall remain as a valid correction.

Signed and Sealed this

Seventh Day of September, 2004

JON W. DUDAS
*Director of the United States Patent and Trademark Office*